United States Patent
Wang et al.

(10) Patent No.: US 11,430,913 B2
(45) Date of Patent: Aug. 30, 2022

(54) LED CHIP, LED LIGHT EMITTING SUBSTRATE, DISPLAY DEVICE AND CONTROL METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Huijuan Wang, Beijing (CN); Meili Wang, Beijing (CN); Zhenhua Lv, Beijing (CN); Fei Wang, Beijing (CN); Zezhou Yang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 1109 days.

(21) Appl. No.: 16/063,336

(22) PCT Filed: Dec. 7, 2017

(86) PCT No.: PCT/CN2017/114888
§ 371 (c)(1),
(2) Date: Jun. 18, 2018

(87) PCT Pub. No.: WO2018/188360
PCT Pub. Date: Oct. 18, 2018

(65) Prior Publication Data
US 2020/0274025 A1    Aug. 27, 2020

(30) Foreign Application Priority Data
Apr. 12, 2017    (CN) .......................... 201710238220.1

(51) Int. Cl.
*H01L 33/06*    (2010.01)
*H01L 25/075*    (2006.01)
(Continued)

(52) U.S. Cl.
CPC ........ *H01L 33/06* (2013.01); *G02F 1/133514* (2013.01); *G02F 1/133528* (2013.01);
(Continued)

(58) Field of Classification Search
CPC ... H01L 33/06; H01L 25/0753; H01L 25/167; H01L 33/32; H01L 33/50; H01L 33/58;
(Continued)

(56) References Cited

U.S. PATENT DOCUMENTS

2001/0030318 A1* 10/2001 Nakamura ............... H01L 33/32
257/13
2002/0167019 A1* 11/2002 Nakamura ............... H01L 33/32
257/14
(Continued)

FOREIGN PATENT DOCUMENTS

| CN | 101346827 A | 1/2009 |
| CN | 101384120 A | 3/2009 |

(Continued)

OTHER PUBLICATIONS

Search Report and Written Opinion for International Application No. PCT/CN2017/114888 dated Mar. 8, 2018.
(Continued)

*Primary Examiner* — Victor A Mandala
(74) *Attorney, Agent, or Firm* — Calfee, Halter & Griswold LLP (57) ABSTRACT

The present disclosure relates to the field of LED display technologies, and provides an LED chip, an LED light emitting substrate, a display device and a control method thereof. Specifically, the LED chip comprises: an N-type semiconductor layer, a P-type semiconductor layer, as well as a quantum well layer between the N-type semiconductor layer and the P-type semiconductor layer. The quantum well layer is made of indium gallium nitride, wherein indium
(Continued)

atoms have a molar ratio of greater than or equal to 0.3 in the indium gallium nitride.

13 Claims, 4 Drawing Sheets

(51) Int. Cl.
*H01L 25/16* (2006.01)
*H01L 33/32* (2010.01)
*H01L 33/50* (2010.01)
*H01L 33/58* (2010.01)
*G02F 1/1335* (2006.01)
*G02F 1/13357* (2006.01)
*G09G 3/34* (2006.01)

(52) U.S. Cl.
CPC ..... *G02F 1/133603* (2013.01); *G09G 3/3413* (2013.01); *G09G 3/3426* (2013.01); *H01L 25/0753* (2013.01); *H01L 25/167* (2013.01); *H01L 33/32* (2013.01); *H01L 33/50* (2013.01); *H01L 33/58* (2013.01); *G02F 1/133548* (2021.01); *G09G 2300/0452* (2013.01)

(58) Field of Classification Search
CPC ............. H01L 27/156; G02F 1/133514; G02F 1/133528; G02F 1/133603; G02F 1/133548; G09G 3/3413; G09G 3/3426; G09G 2300/0452; G09G 2300/0426; G09G 3/3225; G09G 3/32
See application file for complete search history.

(56) References Cited

U.S. PATENT DOCUMENTS

| | | | |
|---|---|---|---|
| 2009/0116232 A1 | 5/2009 | Chang et al. | |
| 2009/0302308 A1 | 12/2009 | Chua et al. | |
| 2012/0074385 A1* | 3/2012 | Tak | H01L 21/02642 257/190 |
| 2015/0221820 A1* | 8/2015 | Kim | H01L 33/24 257/13 |
| 2015/0325745 A1* | 11/2015 | Hwang | H01L 33/62 438/27 |
| 2016/0284673 A1 | 9/2016 | Kong et al. | |
| 2017/0213502 A1* | 7/2017 | Henry | H01L 25/167 |

FOREIGN PATENT DOCUMENTS

| | | |
|---|---|---|
| CN | 103700745 A | 4/2014 |
| CN | 103779375 A | 5/2014 |
| CN | 105552188 A | 5/2016 |
| CN | 106816502 A | 6/2017 |
| KR | 100913503 B1 | 8/2009 |

OTHER PUBLICATIONS

First Office Action for Chinese Patent Application No. 201710238330.1 dated Jul. 3, 2018.

\* cited by examiner

Fig. 8 inputting a first current into the LED chip 60 disposed within the red sub-pixel unit A2, a current value of the first current falling in a range of smaller than 0.1mA  S101 inputting a second current into the LED chip 60 disposed within the green sub-pixel unit A3, a current value of the second current falling in a range of 25mA-100mA  S102 inputting a third current into the LED chip 60 disposed within the blue sub-pixel unit A1, a current value of the third current falling in a range of greater than 0.5mA  S103

LED CHIP, LED LIGHT EMITTING SUBSTRATE, DISPLAY DEVICE AND CONTROL METHOD THEREOF

The present application is the U.S. national phase entry of PCT/CN2017/114888 filed on Dec. 7, 2017, which claims the priority of the Chinese patent application No. 201710238220.1 filed on Apr. 12, 2017, the entire disclosures of both are incorporated herein by reference.

TECHNICAL FIELD

The present disclosure relates to the field of LED display technologies, and in particular to an LED chip, an LED light emitting substrate, a display device and a control method thereof.

BACKGROUND ART

Light emitting diodes (LEDs) belong to semiconductor diodes and are a type of photoelectric elements that emit light based on the unidirectional conductivity of semiconductor PN junctions. LEDs are lighting elements as widely used on the current market in a worldwide range, and have advantages such as small volume, high luminance, low power consumption, less heat dissipation, long service life, and environmental friendliness. Besides, they are also popular with customers for being rich and varied in color.

As backlight sources, LED chips play an indispensable role in electronic products that need backlight display, such as a cell phone or a television. With an increasingly reduce in size of the electronic products, it is required that the size of LED chips should also be reduced considerably, so as to achieve stronger and more stable display luminance in a smaller size range.

Micro LED refers to the technique of scaling and matrixing LED chips. Specifically, for a Micro LED, an array of LED chips of a microsize and a high density is integrated on one chip, wherein each LED chip can be addressed and driven to emit light individually. In this way, a distance between pixels of two adjacent LED chips can be reduced from a millimeter scale to a micrometer scale. Thus, the display effect can be improved. Meanwhile, Micro LEDs also have advantages such as high energy efficiency, high resolution, small volume and thinness.

SUMMARY

Embodiments of the present disclosure provide an LED chip, an LED light emitting substrate, a display device and a control method thereof, so as to solve or at least alleviate one or more of the technical problems as mentioned above.

According to one aspect of the present disclosure, an LED chip is provided, comprising: an N-type semiconductor layer, a quantum well layer and a P-type semiconductor layer, wherein the quantum well layer is located between the N-type semiconductor layer and the P-type semiconductor layer. Besides, the quantum well layer is made of indium gallium nitride, wherein indium atoms have a molar ratio of greater than or equal to 0.3 in the indium gallium nitride.

Optionally, in a specific embodiment, the indium atoms have a molar ratio of 0.4 in the indium gallium nitride.

Furthermore, in an embodiment of the present disclosure, the LED chip further comprises a substrate layer, and the substrate layer is provided with a buffer layer. In this case, the N-type semiconductor layer, the quantum well layer and the P-type semiconductor layer are arranged on the buffer layer as a whole.

According to another aspect of the present disclosure, an LED light emitting substrate is provided. The LED light emitting substrate comprises: a plurality of said LED chips and a circuit board, wherein the LED chips are arranged on the circuit board. Specifically, the circuit board comprises a base substrate and a drive circuit arranged on the base substrate for driving the LED chips.

Optionally, in a specific embodiment, the circuit board comprises a CMOS substrate or a TFT substrate.

According to yet another aspect of the present disclosure, a display device is further provided. The display device comprises the LED light emitting substrate as mentioned above and an array of pixel units, each pixel unit comprising a plurality of sub-pixel units. Specifically, each LED chip on the LED light emitting substrate is located within a sub-pixel unit, and the drive circuit of the LED light emitting substrate is used for transferring current to each LED chip such that the LED chip emits light of a corresponding wavelength.

Optionally, in the display device as provided by an embodiment of the present disclosure, each pixel unit at least comprises a blue sub-pixel unit, and a blue filter layer is further arranged on a light exit side of the LED chip corresponding to each blue sub-pixel unit.

Optionally, in a specific embodiment of the display device, each pixel unit further comprises a red sub-pixel and a green sub-pixel. Besides, a red filter layer is arranged on a light exit side of the LED chip corresponding to each red sub-pixel unit, and a green filter layer is arranged on a light exit side of the LED chip corresponding to each green sub-pixel unit.

Furthermore, according to an embodiment of the present disclosure, the display device further comprises a lower polarizing unit, a liquid crystal layer and an upper polarizing unit arranged sequentially in a light exit direction of the LED light emitting substrate, wherein a transmission axis direction of the lower polarizing unit is perpendicular to or in parallel with a transmission axis direction of the upper polarizing unit.

Optionally, in a specific embodiment, the lower polarizing unit and/or the upper polarizing unit is a metal wire grating.

Optionally, in other embodiments, the lower polarizing unit is a metal wire grating, and the metal wire grating is arranged on a light exit side of each LED chip.

According to still another aspect of the present disclosure, a method for controlling a display device to achieve color display is further provided. Specifically, the display device comprises: the LED light emitting substrate as mentioned above; and an array of pixel units, each pixel unit comprising a blue sub-pixel unit, a green sub-pixel unit and a red sub-pixel unit. Optionally, the display device further comprises a blue filter layer, a red filter layer and a green filter layer arranged respectively on light exit sides of the LED chips corresponding to each blue sub-pixel unit, each red sub-pixel unit and each green sub-pixel unit respectively. Besides, each LED chip on the LED light emitting substrate is located within a corresponding sub-pixel unit, and the drive circuit of the LED light emitting substrate is used for transferring current to each LED chip such that the LED chip emits light of a corresponding wavelength. The control method comprises: inputting a first current into the LED chip disposed within the red sub-pixel unit; inputting a second current into the LED chip disposed within the green sub-pixel unit; and inputting a third current into the LED chip disposed within the blue sub-pixel unit, wherein a current value of the third current is larger than a current value of the first current, but smaller than a current value of the second current. Optionally, a current value of the first current falls in a range of smaller than 0.1 mA, a current value of the second current falls in a range of 25 mA-100 mA, and a current value of the third current falls in a range of greater than 0.5 mA.

Optionally, according to an embodiment of the present disclosure, in the above control method, the current value of the first current is 0.1 mA, the current value of the second current is 60 mA, and the current value of the third current is 8 mA.

Further optionally, according to an embodiment of the present disclosure, in the above control method, a duty cycle of the third current is larger than a duty cycle of the second current, but smaller than a duty cycle of the first current. As an example, in other embodiments of the present disclosure, a ratio of duty cycles of the first current, the second current and the third current is 120:1:4.

BRIEF DESCRIPTION OF DRAWINGS

In order to illustrate technical solutions of embodiments of the present disclosure more clearly, drawings to be used in depictions of the embodiments will be briefly introduced as follows. Apparently, the drawings in the depictions as below are only some embodiments of the present disclosure. For a person having ordinary skills in the art, other embodiments can also be obtained from these drawings without any inventive efforts.

DETAILED DESCRIPTION OF EMBODIMENTS

The technical solutions in embodiments of the present disclosure shall be described clearly and completely as follows with reference to the drawings in the embodiments of the present disclosure. Apparently, the embodiments as described below are only part of the embodiments of the present disclosure, rather than all of them. Based on the embodiments in the present disclosure, all other embodiments obtainable by a person having ordinary skills in the art without any inventive efforts shall fall within the protection scope of the present disclosure.

In the depictions as follows, various components are designated by the following reference signs respectively: 10—N-type semiconductor layer; 11—lower polarizing unit; 12—upper polarizing unit; 13—liquid crystal layer; 20—quantum well layer; 30—P-type semiconductor layer; 40—substrate layer; 50—buffer layer; 60—LED chip; 70—circuit board; 80—LED light emitting substrate; 91—blue filter layer; 92—red filter layer; 93—green filter layer; A—sub-pixel unit, A1—blue sub-pixel unit; A2—red sub-pixel unit; and A3—green sub-pixel unit.

Figure 1:
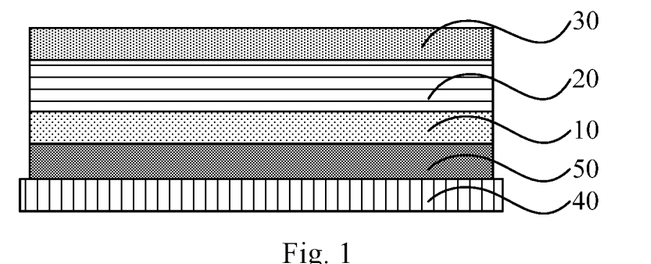
FIG. 1 is a schematic sectional view of the LED chip according to an embodiment of the present disclosure.

According to an embodiment of the present disclosure, an LED chip is provided. As shown in FIG. 1, the LED chip comprises: an N-type semiconductor layer 10, a quantum well layer 20 and a P-type semiconductor layer 30. Specifically, the quantum well layer 20 is located between the N-type semiconductor layer 10 and the P-type semiconductor layer 30. Besides, the quantum well layer 20 is further made of indium gallium nitride, wherein indium atoms have a molar ratio of greater than or equal to 0.3 in the indium gallium nitride.

Light emitting diodes (LEDs) are mainly composed of PN junctions, and have a unidirectional conductivity. Specifically, the light emitting principle of LEDs can be simply summarized as follows. After a positive voltage is applied to the LEDs, holes injected from a P region to an N region and electrons injected from the N region to the P region are recombined with electrons in the N region and holes in the P region respectively, within several micrometers near the PN junction. Thereby, while the electrons and the holes disappear, photons are generated, and spontaneous emission fluorescence is generated. The energy state (band gap) in which the electrons and the holes are located varies for different semiconductor materials. Therefore, the amount of energy released from the recombination of electrons and holes will also vary. The greater the energy difference between electrons and holes is, the higher the energy of the generated photons will be. Besides, the energy of photons further corresponds to the color of light. Since different materials have different band gaps, light of different colors can be emitted. LED chips are a type of solid semiconductor devices, which is capable of achieving LED light emitting display.

It should be noted that in an LED chip according to an embodiment of the present disclosure, the sequence of forming the N-type semiconductor layer 10, the quantum well layer 20 and the P-type semiconductor layer 30 is not limited to the case as shown in FIG. 1, i.e., in the order of N-type semiconductor layer 10, quantum well layer 20 and P-type semiconductor layer 30 from bottom to top. In contrast, in other embodiments, the P-type semiconductor layer 30, the quantum well layer 20 and the N-type semiconductor layer 10 can also be arranged sequentially from bottom to top. Those skilled in the art can make arrangement upon specific use requirements.

Besides, it should also be pointed out that when the quantum well layer 20 is made of indium gallium nitride and the indium atoms have a molar ratio of greater than or equal to 0.3 in indium gallium nitride, the molar ratio of indium atoms is relatively high in indium gallium nitride. If such a quantum well layer 20 is used to fabricate an LED chip, when a drive current is fed, light emitted from the LED chip will be blue-shifted as the drive current increases. This means that the wavelength of emitted light will gradually decrease with the increase of drive current. I.e., the color of display light will gradually change from red toward green.

According to an embodiment of the present disclosure, an LED chip is provided, comprising: an N-type semiconductor layer, a quantum well layer and a P-type semiconductor layer. Besides, the quantum well layer is made of indium gallium nitride, wherein indium atoms have a molar ratio of greater than or equal to 0.3 in indium gallium nitride. In other words, the quantum well layer in the LED chip is formed of indium gallium nitride, and the molar ratio of the indium atoms in indium gallium nitride is selected to be greater than or equal to 0.3. In this way, when a light emitting substrate made of the LED chip is applied in a display device, the color of light emitted from the LED chip can be controlled by adjusting the magnitude of current inputted into the LED chip. Therefore, when applied to a display device, color display can be achieved.

Optionally, in the LED chip according to an embodiment of the present disclosure, indium atoms have a molar ratio of 0.4 in indium gallium nitride.

Figure 2:
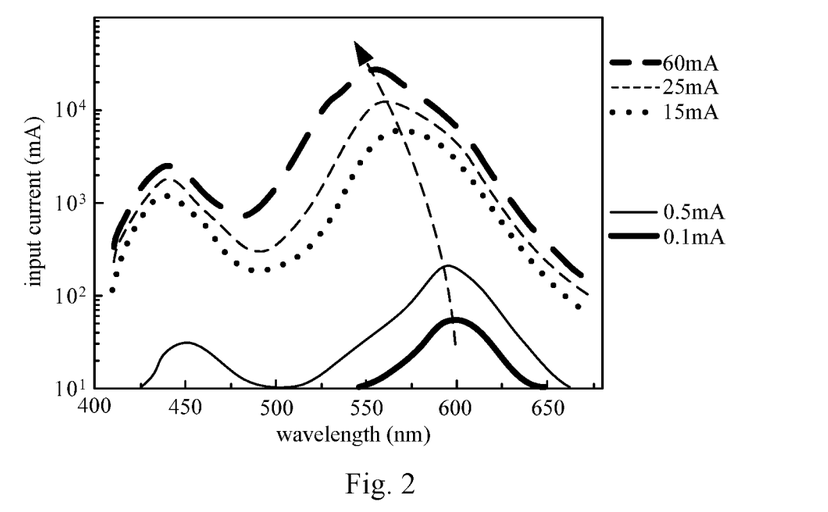
FIG. 2 is a spectrum chart showing how the wavelength of light emitted from the LED chip according to an embodiment of the present disclosure varies with the inputted drive current.

This means that not only is the quantum well layer 20 formed of an indium gallium nitride material, but the molar ratio of the indium atoms in indium gallium nitride is selected to be 0.4. The change in spectrum of the LED chip as made in this way, upon feeding of a drive current, is shown in FIG. 2, which illustrates how the wavelength of emitted light varies as the drive current increases. As seen from the dashed arrow in FIG. 2, when the drive current increases gradually from 0.1 mA to 60 mA, the emitted light will be blue-shifted. In other words, the wavelength of emitted light decreases gradually as the drive current increases. As shown in FIG. 2, the wavelength of light shifts from 600 nm to 550 nm, and the color of light changes gradually from red to green.

Furthermore, as shown in FIG. 1, in an embodiment of the present disclosure, the LED chip further comprises a substrate layer 40, and the substrate layer 40 is provided with a buffer layer 50. Specifically, the N-type semiconductor layer 10, the quantum well layer 20 and the P-type semiconductor layer 30 are arranged on the buffer layer 50 as a whole.

The substrate layer 40 is usually formed from one of the following three materials: sapphire ($Al_2O_3$), silicon (Si) and silicon carbide (SiC). Assuming the substrate layer 40 is made from sapphire ($Al_2O_3$) material. In this case, a buffer layer 50 can be formed first on the substrate layer 40. After that, an N-type semiconductor layer 10, a quantum well layer 20 and a P-type semiconductor layer 30 are formed on the buffer layer 50. Specifically, in forming the above epitaxial structure, a metal-organic chemical vapor deposition (MOCVD) process is usually adopted. Obviously, those skilled in the art should understand that other manufacture processes can also be adopted in the above procedure, and embodiments of the present disclosure are not limited thereto.

Figure 3:
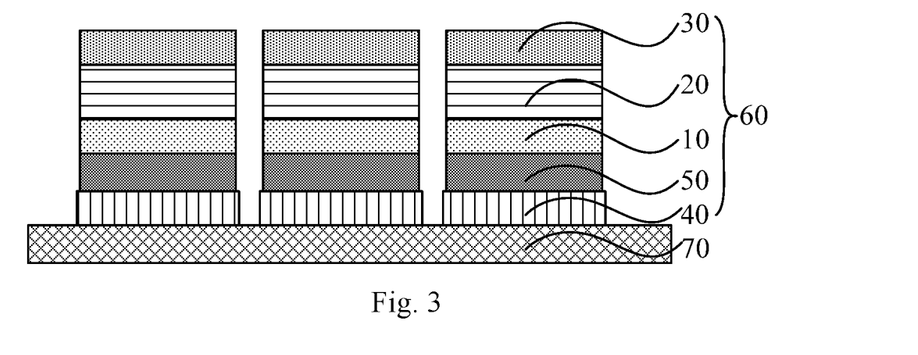
FIG. 3 is a schematic structure view of the LED light emitting substrate according to an embodiment of the present disclosure.

According to another aspect of the present disclosure, an LED light emitting substrate is provided. The LED light emitting substrate comprises a plurality of LED chips 60 as described above. As shown in FIG. 3, the LED light emitting substrate comprises three LED chips 60 and a circuit board 70. The circuit board 70 comprises a base substrate and a drive circuit arranged on the base substrate for driving the LED chips 60. Besides, the LED chips 60 are arranged on the circuit board 70.

The circuit board 70 comprises a base substrate and a drive circuit arranged on the base substrate, and the LED chips 60 are arranged on the circuit board 70. In this case, light emission from the LED chips 60 can be controlled by inputting a drive current into the LED chips 60 via the drive circuit on the circuit board 70.

It should be noted that when the LED chips 60 according to embodiments of the present disclosure is applied to a Micro LED, the LED chips 60 will be integrated into an array of chips with high density. In this way, if each LED chip 60 is smaller than 50 µm in size, the size of each LED chip 60 will be very small. In this case, the LED chips 60 are usually peeled off at the position of the buffer layer 50, and then the peeled LED chips 60 are transferred to the circuit board 70 for connecting to the corresponding drive circuit. By peeling the chip structure at the buffer layer 50, the chip structure over the buffer layer 50 can be protected against damages during the process of peeling. Thereby, the LED chips 60 transferred to the circuit board 70 will not comprise the substrate layer 40. When the size of each LED chip 60 is not less than 100 µm, as shown in FIG. 3, the LED chips 60 will usually be cut together with a portion of substrate layer 40 with certain thickness. After that, the LED chips 60 with the portion of substrate layer 40 is transferred to the circuit board 70 and connected to the corresponding drive circuit. In this way, when connected to the drive circuit and emitting light, the LED chips 60 with the portion of substrate layer 40 have a more stable function.

Optionally, in a specific embodiment, the circuit board 70 comprises a CMOS substrate or a TFT substrate.

For example, when the LED light emitting substrate as provided by embodiments of the present disclosure is applied in an OLED display device, the circuit board 70 can be a TFT substrate. In this case, each layer is fabricated by processes such as film-forming, developing, peeling, exposure and etching, so as to form the TFT substrate. After that, the LED chips 60 are peeled and transferred to the TFT substrate. Thereby, a drive current can be inputted into the LED chips 60 via the drive circuit as fabricated on the TFT substrate.

Figure 4:
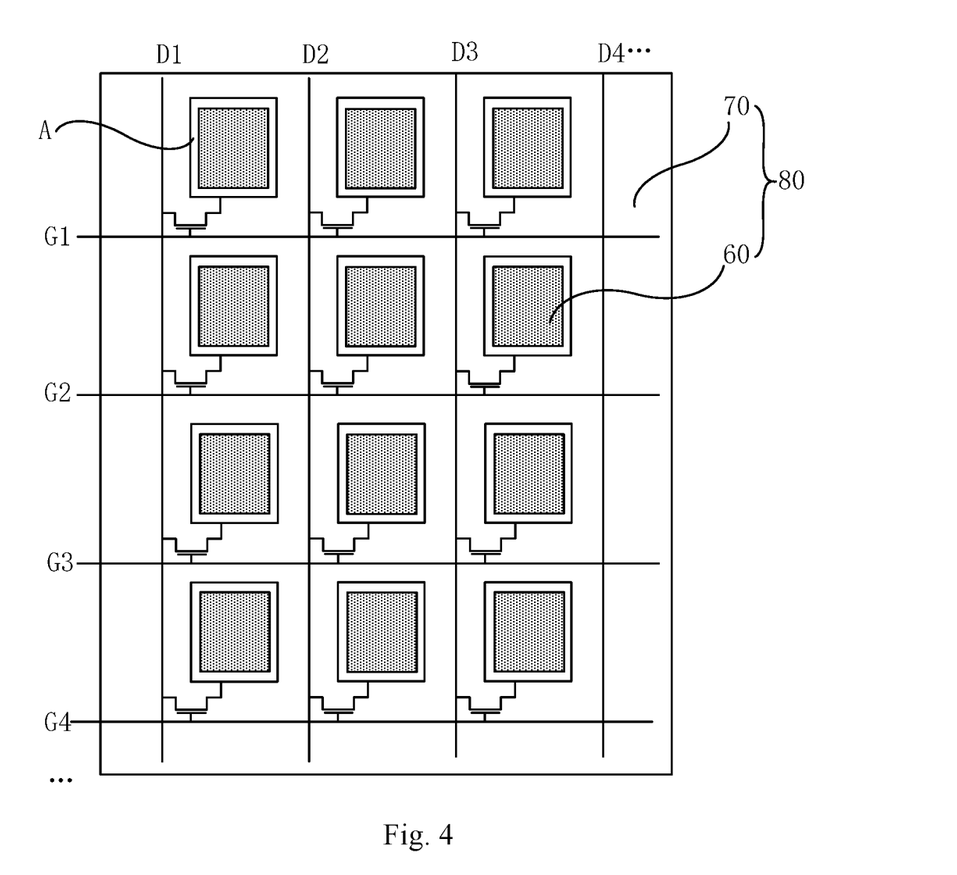
FIG. 4 is a schematic structure view of the display device according to an embodiment of the present disclosure.

According to yet another aspect of the present disclosure, a display device is provided. As shown in FIG. 4, the display device comprises the LED light emitting substrate 80 and an array of pixel units, each pixel unit comprising a plurality of sub-pixel units. Furthermore, each LED chip 60 on the LED light emitting substrate 80 is arranged within a corresponding sub-pixel unit A, and the drive circuit of the LED light emitting substrate 80 is used for transferring current to each LED chip 60 such that the LED chip 60 emits light of a corresponding wavelength.

For example, with reference to FIG. 4, in the display device, the circuit board 70 of the LED light emitting substrate 80 is a TFT substrate, and a plurality of sub-pixel units A are defined on the TFT substrate by intersecting gate lines (G1, G2, G3, G4 . . . in FIG. 4) and data lines (D1, D2, D3, D4 . . . in FIG. 4). Each LED chip 60 on the LED light emitting substrate 80 is arranged within a corresponding sub-pixel unit A. The drive circuit on the TFT substrate can address and control each LED chip 60 individually by scanning, and input drive currents into the LED chips 60 disposed within different sub-pixel units A. It should be pointed out that current values of the drive currents can be either the same or different herein. After that, each LED chip 60 emits light of a corresponding wavelength depending on the inputted drive currents. Thereby, when the LED chips 60 arranged within each sub-pixel unit A have a same structure, one can adjust the current value of drive current as inputted into each LED chip 60, thereby controlling the display device to achieve color display.

Figure 5:
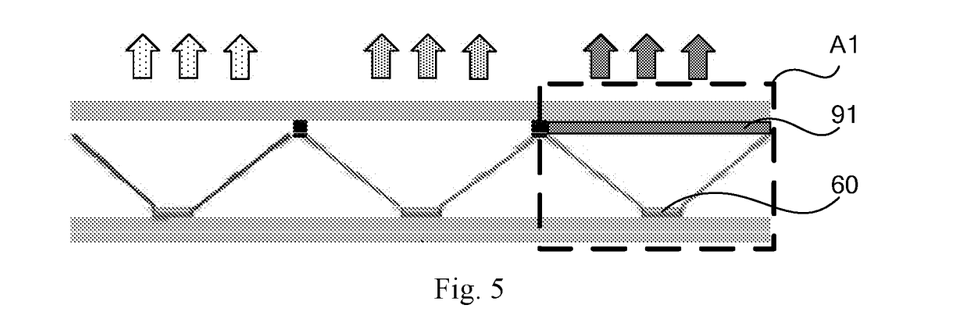
FIG. 5 is a schematic structure view of a blue filter layer arranged on a light exit side of the LED chip corresponding to the blue sub-pixel unit in a pixel unit of the display device according to an embodiment of the present disclosure.

Optionally, as shown in FIG. 5, in an embodiment of the present disclosure, the display device comprises at least three primary color sub-pixel units, in particular, a blue sub-pixel unit. Besides, a blue filter layer 91 is further arranged on a light exit side of the LED chip 60 corresponding to each blue sub-pixel unit A1.

In an embodiment of the present disclosure, the spectrum of the LED chips 60 always comprises a blue component. In this case, a blue filter layer 91 is arranged on a light exit side of the LED chip 60 corresponding to each blue sub-pixel unit A1. In this way, by inputting into the LED chip 60 corresponding to the blue sub-pixel unit A1 a random current value within a range as shown in FIG. 2, the LED chip 60 is enabled to emit light. Then, the emitted light passes through the blue filter layer 91 and is filtered thereby. Therefore, the LED chip 60 corresponding to the blue sub-pixel unit A1 is made to finally emit blue light to the outside, and lights of other colors are all blocked by the blue filter layer 91.

Figure 6:
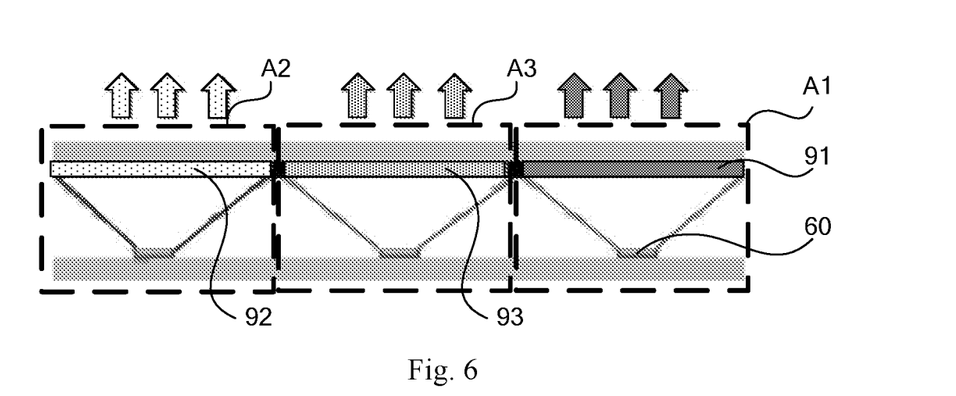
FIG. 6 is a schematic structure view of a red filter layer and a green filter layer arranged respectively on light exit sides of the LED chips corresponding to the red sub-pixel unit and the green sub-pixel unit in a pixel unit of the display device according to an embodiment of the present disclosure.

Preferably, as shown in FIG. 6, the at least three primary color sub-pixel units further comprise a red sub-pixel unit and a green sub-pixel unit. Besides, a red filter layer 92 is further arranged on a light exit side of the LED chip 60 corresponding to each red sub-pixel unit A2, and a green filter layer 93 is further arranged on a light exit side of the LED chip 60 corresponding to each green sub-pixel unit A3.

In this case, by controlling the current value as inputted into the LED chips 60, and in particular, by inputting a low current value (an input current of 0.1 mA as shown in FIG. 2) into the LED chips 60, the LED chips 60 are enabled to emit red light. Similarly, by inputting a high current value (an input current of 60 mA as shown in FIG. 2) into the LED chips 60, the LED chips 60 are enabled to emit green light. In this way, by using the filtering function of the corresponding blue filter layer 91, red filter layer 92 and green filter layer 93, light exit sides of the LED chips 60 can finally exhibit blue, red and green. Accordingly, by inputting into the LED chips 60 a current value of different magnitudes, display of the three primary colors of red, green and blue can be achieved. Moreover, the display device according to embodiments of the present disclosure is enabled to achieve full color display.

For example, as shown in FIG. 6, each pixel unit in the display device comprises a red sub-pixel unit A2, a green sub-pixel unit A3 and a blue sub-pixel unit A1. In this case, the LED chip 60 arranged within each red sub-pixel unit A2 will emit red light on the light exit side, the LED chip 60 arranged within each green sub-pixel unit A3 will emit green light on the light exit side, and the LED chip 60 arranged within each blue sub-pixel unit A1 will emit blue light on the light exit side. By controlling light emissions of the red sub-pixel unit A2, the green sub-pixel unit A3 and the blue sub-pixel unit A1 in each pixel unit, a desired color picture can be displayed on the display device. Besides, since the spectrum of LED chips 60 always comprise a blue component, this may lead to a poor purity in the red light emitted from the red sub-pixel unit A2 and the green light emitted from the green sub-pixel unit A3, thereby influencing the color display effect of the display device. In view of above, as shown in FIG. 6, a red filter layer 92 can be further arranged on the light exit side of the LED chip 60 corresponding to each red sub-pixel unit A2, which filters light emitted from the red sub-pixel unit A2 and blocks lights other than red light. Likewise, a green filter layer 93 can be further arranged on the light exit side of the LED chip 60 corresponding to each green sub-pixel unit A3, which filters light emitted from the green sub-pixel unit A3 and blocks lights other than green light. In this way, the purity of light emitted from each sub-pixel unit A can be enhanced. Thus, the color display effect of the display device can be improved.

It should also be noted that in the display device according to embodiments of the present disclosure, the blue filter layer 91, the red filter layer 92 and the green filter layer 93 can be filters, or any material in any form capable of allowing passage of light of a particular wavelength and blocking light of other wavelengths. The present disclosure is not limited thereto.

Furthermore, in an embodiment of the present disclosure, the display device can comprise a liquid crystal display device. In this case, as shown in FIG. 7, the display device will further comprise a lower polarizing unit 11, a liquid crystal layer 13 and an upper polarizing unit 12 as arranged sequentially in a light exit direction of the LED light emitting substrate 80, wherein a transmission axis direction of the lower polarizing unit 11 is perpendicular to or in parallel with a transmission axis direction of the upper polarizing unit 12.

Figure 7:
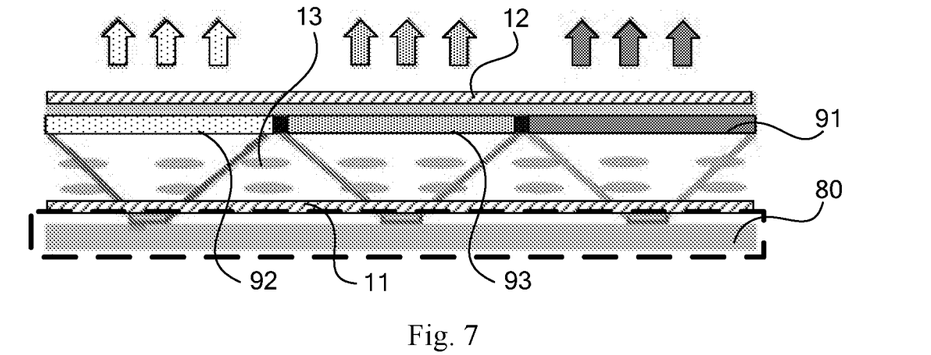
FIG. 7 is a schematic structure view of the display device comprising a lower polarizing unit, a liquid crystal layer and an upper polarizing unit according to an embodiment of the present disclosure.

As shown in FIG. 7, when the display device is a liquid crystal display device, a lower polarizing unit 11, a liquid crystal layer 13 and an upper polarizing unit 12 will be arranged sequentially in a light exit direction of the LED light emitting substrate 80. In this case, light emitted from the LED light emitting substrate 80 will first pass through the lower polarizing unit 11. After that, only part of light with the same polarizing direction as the transmission axis direction of the lower polarizing unit 11 can pass through the lower polarizing unit 11 and enter the liquid crystal layer 13. In the following, this part of light is emitted towards the upper polarizing unit 12 after being deflected by liquid crystal molecules in the liquid crystal layer 13. Then, only part of light with the same polarizing direction as the transmission axis direction of the upper polarizing unit 12 can be emitted out through the upper polarizing unit, thereby achieving display.

It should be noted that, in embodiments of the present disclosure, the transmission axis directions of the lower polarizing unit 11 and the upper polarizing unit 12 can be perpendicular to each other, or in parallel with each other. For example, when the transmission axis directions of the lower polarizing unit 11 and the upper polarizing unit 12 are perpendicular to each other, the liquid crystal molecules in the liquid crystal layer 13 are arranged in a twisted nematic (TN) display mode. For the TN display mode, given no external voltage applied, the part of light passing through the lower polarizing unit 11 will theoretically be all emitted out from the upper polarizing unit 12. Therefore, backlight of the display device will be projected to be a "constant white mode". On the contrary, when the transmission axis directions of the lower polarizing unit 11 and the upper polarizing unit 12 are parallel to each other, the backlight will be projected to be a "constant black mode" given no external voltage applied.

It should be further pointed out that in the display device according to embodiments of the present disclosure, the upper polarizing unit 12 and the lower polarizing unit 11 can be polarizers. Alternatively, other structures can be used, as long as they can allow passage of light having the same polarizing direction as the transmission axis direction thereof.

Besides, it should be further noted that the liquid crystal molecules in the liquid crystal layer 13 are usually arranged between two substrates and sealed by a sealant on sides, so as to avoid leakage of the liquid crystal molecules. In embodiments of the present disclosure, neither the upper polarizing unit 12 nor the lower polarizing unit 11 is required to be specially located with respect to the two substrates. For example, as shown in FIG. 7, the upper polarizing unit 11 can be arranged outside the substrate above the liquid crystal layer 13. Alternatively, the upper polarizing unit 11 can also be arranged inside the substrate above the liquid crystal layer 13, as long as light emitted from the LED light emitting substrate 80 is ensured to passes through the lower polarizing unit 11, the liquid crystal layer 13 and the upper polarizing unit 12 sequentially.

Optionally, in the display device according to an embodiment of the present disclosure, the lower polarizing unit 11 and/or the upper polarizing unit 12 is a metal wire grating.

In this way, when the lower polarizing unit 11 and/or the upper polarizing unit 12 is a metal wire grating, the metal wire grating can be integrated on other substrates by nano-imprinting or the like. For instance, for the lower polarizing unit 11, it can be integrated on the LED light emitting substrate 80 by nano-imprinting, so that no extra polarizer layer is required. This reduces thickness of the display device, and improves thinness and light weight of the display device.

Figure 8:
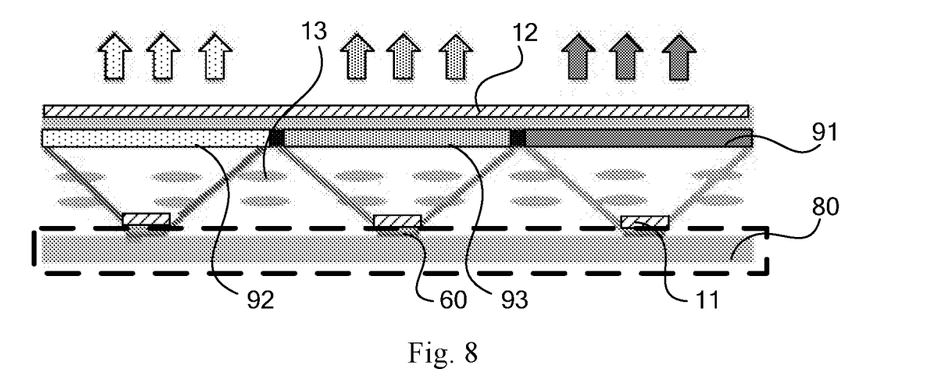
FIG. 8 is a schematic structure view of the display device comprising a lower polarizing unit, a liquid crystal layer and an upper polarizing unit according to a further embodiment of the present disclosure.

Optionally, as shown in FIG. 8, the lower polarizing unit 11 is a metal wire grating, and the metal wire grating is arranged on a light exit side of each LED chip 60.

In this case, with reference to FIG. 8, the LED chips 60 are enabled to emit polarized light by simply fabricating a metal wire grating on the light exit side of each LED chip 60 by nano-imprinting or the like. In this case, the polarizing direction of light emitted from each LED chip 60 is the same as an extension direction of grating bars of the metal wire grating. Meanwhile, by means of the metal wire grating arranged on the light exit side of the LED chips 60, light emitted from the LED chips 60 can be filtered too. Thereby, no metal wire grating is required in regions other than the LED chips 60. This helps to save the material for fabricating metal wire gratings and simplifies the fabricating process.

Figure 9:
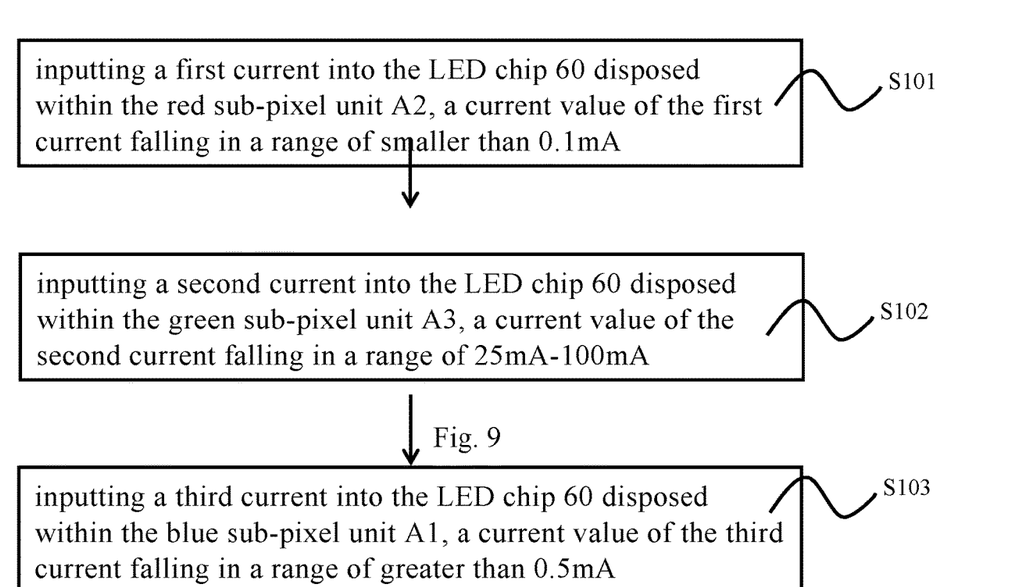
FIG. 9 is a flow chart showing a method for controlling the display device so as to achieve color display according to an embodiment of the present disclosure.

According to still another aspect of the present disclosure, a method for controlling the above display device to achieve color display is provided. As shown in FIG. 9, the method comprises: S101, inputting a first current into the LED chip 60 disposed within the red sub-pixel unit A2, a current value of the first current falling in a range of smaller than 0.1 mA; S102, inputting a second current into the LED chip 60 disposed within the green sub-pixel unit A3, a current value of the second current falling in a range of 25 mA-100 mA; and S103, inputting a third current into the LED chip 60 disposed within the blue sub-pixel unit A1, a current value of the third current falling in a range of greater than 0.5 mA.

It should be noted that in the method for achieving color display according to embodiments of the present disclosure, the steps S101-S103 are not required to be executed in any special sequence. In fact, the steps S101-S103 can be executed simultaneously, or in a random sequence. The step sequence as listed above is only exemplary, and the sequence of steps will not affect implementations of the control method in the present disclosure.

Specifically, in the control method as described above, a first current is inputted into the LED chip 60 disposed within the red sub-pixel unit A2. As shown in FIG. 2, when the current value of the first current is smaller than 0.1 mA, the LED chip 60 can emit red light. Besides, a second current is inputted into the LED chip 60 disposed within the green sub-pixel unit A3. As shown in FIG. 2, when the current value of the second current is a random value between 25 mA and 100 mA, the LED chip 60 can emit green light. Furthermore, a third current is inputted into the LED chip 60 disposed within the blue sub-pixel unit A1. In this case, since the spectrum of the LED chips 60 according to embodiments of the present disclosure always comprises a blue component, the third current can be any value within the spectral range as shown in FIG. 2. Then, the LED chip 60 disposed within the blue sub-pixel unit A1 will emit light, and the light can be displayed as blue light after passing through the blue filter layer 91. If the current value of the third current is extremely small, the light intensity for display within the blue sub-pixel unit A1 will be extremely low. Therefore, in an embodiment of the present disclosure, the current value of the third current is defined to be greater than 0.5 mA. In this way, by controlling the current inputted into each sub-pixel unit, each pixel unit A is enabled to exhibit a corresponding color, and thereby the display device is enabled to achieve color display.

For the LED chips 60, the greater the inputted current value is, the higher the light intensity for display will be. Therefore, in the above display device, although color display can be achieved, the intensity of red light is often far lower than the intensity of green light. This leads to a poor color display effect, and influences the hue in the overall display of the display device, thus causing problems such as distortion and discoloring in the finally exhibited color. In order to solve these problems, in an embodiment of the present disclosure, a ratio of a duty cycle of the first current to a duty cycle of the second current can be adjusted, thereby balancing the difference in light intensity between red light and green light. In this way, the accuracy of color display can be improved, and a better display effect can be achieved for the display device.

In addition, typically, the liquid crystal layer 13 can be deflected at a corresponding angle under the control of voltage. Therefore, apart from balancing the light intensities of light with different colors by adjusting the duty cycles, when the display device is a liquid crystal display device, one can also adjust the deflection of liquid crystal molecules in the liquid crystal layer 13 corresponding to each pixel unit. This helps to adjust the luminance and the hue of light finally displayed by each pixel unit, thereby improving the effect of color display by the display device.

Optionally, in an embodiment of the present disclosure, the first current inputted into the LED chip 60 disposed within the red sub-pixel unit A2 can be a current having a current value of 0.1 mA. The second current inputted into the LED chip 60 disposed within the green sub-pixel unit A3 can be a current having a current value of 60 mA. The third current inputted into the LED chip 60 disposed within the blue sub-pixel unit A1 can be a current having a current value of 8 mA.

When the current value of the first current is 0.1 mA, light emitted from the LED chip 60 within the red sub-pixel unit A2 has a higher proportion of red light and a better purity. Likewise, when the current value of the second current is 60 mA, light emitted from the LED chip 60 within the green sub-pixel unit A3 has a higher proportion of green light and a better purity. Besides, when the current value of the third current is 8 mA, on one hand, the LED chip 60 arranged within the blue sub-pixel unit A1 is ensured to have a sufficient light emitting intensity, and on the other hand, the power consumption of the third current is reduced.

Figure 10:
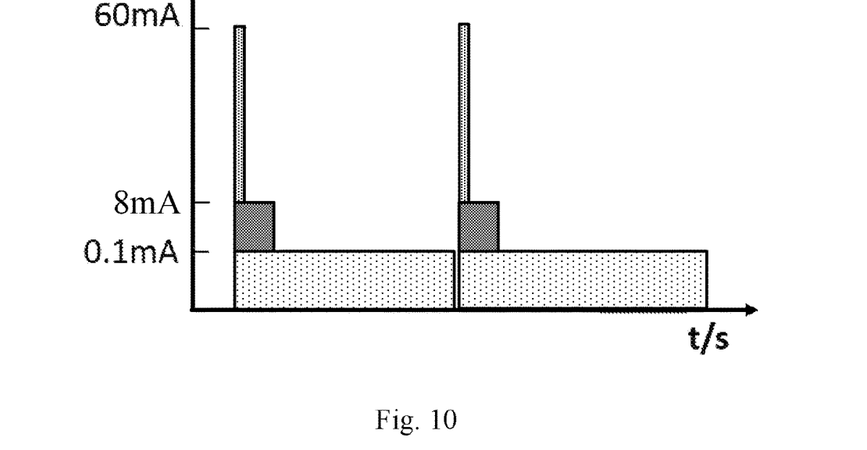
FIG. 10 is a schematic view showing the relationship between duty cycles of the first current, the second current and the third current in the method for controlling the display device so as to achieve color display according to an embodiment of the present disclosure.

Optionally, as shown in FIG. 10, a ratio of duty cycles of the first current, the second current and the third current is 120:1:4.

With reference to FIG. 10, for each pixel unit A, when the current value of the first current is 0.1 mA, the current value of the second current is 60 mA and the current value of the third current is 8 mA, a ratio of duty cycles of the first current, the second current and the third current will be 120:1:4. In this way, an optimal white balance can be achieved, thereby reducing the possibility of color shift of the display device, and further improving the color display effect and color authenticity of the display device.

What mentioned above are only specific embodiments of the present disclosure. However, the protection scope of the present disclosure is not limited thereto. Any variation or substitution easily conceivable within the technical scope as disclosed in the present disclosure for a skilled person, who is familiar with this technical field, shall fall within the protection scope of the present disclosure. Therefore, the protection scope of the present disclosure shall be subject to the protection scope of the appended claims.

The invention claimed is:

1. A display device, comprising:
a LED light emitting substrate, and
an array of pixel units, each pixel unit comprising a plurality of sub-pixel units, wherein
the LED light emitting substrate comprises a plurality of LED chips and a circuit board, wherein the LED chips comprises an N-type semiconductor layer, a quantum well layer and a P-type semiconductor layer, the quantum well layer is located between the N-type semiconductor layer and the P-type semiconductor layer, and the quantum well layer is made of indium gallium nitride, wherein indium atoms have a molar ration of greater than or equal to 0.3 in the indium gallium nitride, the LED chips are arranged on the circuit board, and the circuit board comprises a base substrate and a drive circuit arranged on the base substrate for driving the LED chips,
each LED chip of the LED light emitting substrate is located within a sub-pixel unit, and
the drive circuit of the LED light emitting substrate is configured to transfer current to each LED chip such that the LED chip emits light of a corresponding wavelength.

2. The display device according to claim 1, wherein each pixel unit at least comprises a blue sub-pixel unit, and
a blue filter layer is further arranged on a light exit side of the LED chip corresponding to each blue sub-pixel unit.

3. The display device according to claim 2, wherein each pixel unit further comprises a red sub-pixel unit and a green sub-pixel unit, and
a red filter layer is further arranged on a light exit side of the LED chip corresponding to each red sub-pixel unit, and a green filter layer is further arranged on a light exit side of the LED chip corresponding to each green sub-pixel unit.

4. The display device according to claim 2, further comprises:
a lower polarizing unit, a liquid crystal layer and an upper polarizing unit arranged sequentially in a light exit direction of the LED light emitting substrate, wherein a transmission axis direction of the lower polarizing unit is perpendicular to or in parallel with a transmission axis direction of the upper polarizing unit.

5. The display device according to claim 4, wherein at least one of the lower polarizing unit and the upper polarizing unit comprises a metal wire grating.

6. The display device according to claim 5, wherein the lower polarizing unit comprises a metal wire grating, and
the metal wire grating is arranged on a light exit side of each LED chip.

7. A method for controlling a display device to achieve color display, wherein the display device comprises:
a LED light emitting substrate, and
an array of pixel units, each pixel unit comprising a blue sub-pixel unit, a green sub-pixel unit and a red sub-pixel unit, wherein
the LED light emitting substrate comprises a plurality of LED chips and a circuit board, wherein the LED chips comprises an N-type semiconductor layer, a quantum well layer and a P-type semiconductor layer, the quantum well layer is located between the N-type semiconductor layer and the P-type semiconductor layer, and the quantum well layer is made of indium gallium nitride, wherein indium atoms have a molar ratio of greater than or equal to 0.3 in the indium gallium nitride, the LED chips are arranged on the circuit board, and the circuit board comprises a base substrate and a drive circuit arranged on the base substrate for driving the LED chips,
each LED chip of the LED light emitting substrate is located within a corresponding sub-pixel unit, wherein the drive circuit of the LED light emitting substrate is configured to transfer current to each LED chip such that the LED chip emits light of a corresponding wavelength, and
the method comprising:
inputting a first current into the LED chip disposed within the red sub-pixel unit;
inputting a second current into the LED chip disposed within the green sub-pixel unit; and
inputting a third current into the LED chip disposed within the blue sub-pixel unit, wherein
a current value of the third current is larger than a current value of the first current, but smaller than a current value of the second current.

8. The method according to claim 7, wherein
the current value of the first current is 0.1 mA,
the current value of the second current is 60 mA, and
the current value of the third current is 8 mA.

9. The method according to claim 8, wherein
a ratio of duty cycles of the first current, the second current and the third current is 120:1:4.

10. The method according to claim 7, wherein
the display device further comprises a blue filter layer, a red filter layer and a green filter layer arranged respectively on light exit sides of the LED chips corresponding to each blue sub-pixel unit, each green sub-pixel unit and each red sub-pixel unit.

11. The method according to claim 7, wherein
the current value of the first current falls in a range of smaller than 0.1 mA
the current value of the second current falls in a range of 25 mA-100 mA; and
the current value of the third current falls in a range of greater than 0.5 mA.

12. The method according to claim 7, wherein
a duty cycle of the third current is larger than a duty cycle of the second current, but smaller than a duty cycle of the first current.
13. A display device, comprising:
a LED light emitting substrate, and
an array of pixel units, each pixel unit comprising a plurality of sub-pixel units, wherein
the LED light emitting substrate comprises a plurality of LED chips and a circuit board, wherein the LED chips comprises an N-type semiconductor layer, a quantum well layer and a P-type semiconductor layer, the quantum well layer is located between the N-type semiconductor layer and the P-type semiconductor layer, and the quantum well layer is made of indium gallium nitride, wherein indium atoms have a molar ratio of greater than or equal to 0.3 in the indium gallium nitride, the LED chips are arranged on the circuit board, the circuit board comprises a base substrate and a drive circuit arranged on the base substrate for driving the LED chips, and the circuit board comprises a CMOS substrate or a TFT substrate,
each LED chip of the LED light emitting substrate is located within a sub-pixel unit, and
the drive circuit of the LED light emitting substrate is configured to transfer current to each LED chip such that the LED chip emits light of a corresponding wavelength.

* * * * *